(12) United States Patent
Yamaguti et al.

(10) Patent No.: US 6,271,480 B1
(45) Date of Patent: *Aug. 7, 2001

(54) ELECTRONIC DEVICE

(75) Inventors: Yukio Yamaguti; Hironobu Ikeda, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/073,854

(22) Filed: May 7, 1998

(30) Foreign Application Priority Data

May 9, 1997 (JP) .................................................. 9-119940

(51) Int. Cl.$^7$ ...................................................... H01L 23/48
(52) U.S. Cl. .......................... 174/260; 174/261; 174/267; 29/739; 257/697; 361/760
(58) Field of Search ........................... 174/260, 265, 174/267, 261; 361/760; 29/739, 741, 740; 257/697

(56) References Cited

U.S. PATENT DOCUMENTS 5,296,652 * 3/1994 Miller, Jr. .............................. 174/265

FOREIGN PATENT DOCUMENTS

| 61-76970 | 5/1986 | (JP) . |
| 62-243347 | 10/1987 | (JP) . |
| 63-290000 | * 11/1988 | (JP) . |
| 64-23561 | 1/1989 | (JP) . |
| 2-135766 | 5/1990 | (JP) . |
| 4-239166 | 8/1992 | (JP) . |
| 5-206360 | 8/1993 | (JP) . |

* cited by examiner

Primary Examiner—Albert W. Paladini
(74) Attorney, Agent, or Firm—McGinn & Gibb, PLLC

(57) ABSTRACT

The electronic device is provide that includes a body having an underside; a plurality of conducting members for transferring electronic signals; and at least two alignment pins mounted perpendicularly on the underside. Each of the alignment pins has a flexible portion that is more easily bendable than the other portions.

11 Claims, 5 Drawing Sheets

ELECTRONIC DEVICE

FIELD OF THE INVENTION

The present invention relates to an electronic device and to a mounting structure thereof, and in particular relates to surface mounting electronic device and to a surface mounting structure for mounting the electronic device on at least one surface of a printed circuit board.

This application is based on Japanese Patent Application No. Hei 9-119940, the contents of which are incorporated herein by reference.

BACKGROUND ART

The Japanese Patent Application, first publication, No. Sho 61-208247 discloses an electronic apparatus having a conventional mounting structure. The electronic apparatus comprises a flat-pack IC and a printed circuit board. The flat-pack IC has a plurality of terminal leads protruding horizontally from a body of the flat-pack IC, and alignment leads formed by bending several terminal leads at right angles. The printed circuit board has a plurality of terminal pads for establishing an electrical connection and alignment holes for receiving the alignment leads. The terminal pads are made on the upper surface of the printed circuit board, corresponding to the terminal leads of the flat-pack IC, and the alignment holes corresponds to the alignment leads of flat-pack IC. In the mounting structure of the electronic apparatus, by inserting the alignment leads of the flat-pack IC into the alignment holes on the printed circuit board, the terminal leads are properly aligned with the corresponding terminal pads.

When surface mounting electronic devices are mounted on both surfaces of the printed circuit board, a first electronic device is soldered on one surface, and a second electronic device is thereafter soldered on the underside. In the process of soldering the second electronic device, the board is turned over so that the first electronic device is positioned on the underside of the board.

However, when a heat radiating device is disposed on the upper side, corresponding to the first electronic device on the underside, the first electronic device may accidentally fall from the board, because the solder bonding the first electronic device melts due to the heat to solder the second electronic device and cannot support the weight of the first electronic device. In addition, the same problem occurs when the second electronic device is replaced, because the board is heated in order to remove the second electronic device.

SUMMARY OF THE INVENTION

It is therefore an object of the present invention to provide an electronic device which can be prevented from accidentally falling off from one surface of a mounting board when another electronic device is soldered on the other surfaces of the mounting board.

Another object of the present invention is to provide an electronic device which can be prevented from accidentally falling off from one surface of a mounting board when another electronic device on the other surface of the board is replaced.

In order to accomplish the above object, an electronic device of the present invention comprises: a body having an underside; a plurality of conducting members for transferring electronic signals; and at least two alignment pins mounted perpendicularly on the underside, each of the alignment pins having flexible portion more easily bendable than the other portions. The flexible portion may be thinner than other portions of the alignment pins, or may be formed of a flexible material.

According to the present invention, it is possible to prevent the electronic device from falling off from the board when the electronic device positioned on the underside of the board is heated, because the projecting end of the alignment pin throughout the board can be easily bent.

In another aspect of the present invention, the alignment pins may be arranged at diagonal corners of the rectangular body, may be arranged at midpoints of two opposite sides of the rectangular body, or may be arranged at four corners of the rectangular body. The electronic device may be a pin-grid array for surface mounting.

In another aspect of the present invention, an electronic apparatus of the present invention comprises: a printed circuit board having a plurality of electrically conductive pads and a through hole; and an electronic device mounted on the board, the electronic device having an alignment pin and a plurality of conducting members for transferring electronic signals, the conducting members being connected to the pads, wherein the alignment pins are inserted into the through holes, the projections of the alignment pins from the through holes being bent in order to establish and to maintain a predetermined position of the electronic device relative to the board. A plurality of the electronic devices may be mounted on both surfaces of the board.

It is also possible to prevent the electronic device on one surface of the board from falling off from the board when another electronic device is subsequently mounted on the other surface of the board, because the alignment pins of the electronic devices are inserted into the through holes and the projecting ends of the alignment pins are bent.

DETAILED DESCRIPTION OF THE PREFERRED EMBODIMENTS

The best mode of an electronic device and an electronic apparatus according to embodiments of the present invention will be explained with reference to FIGS. 1 to 7.

First Embodiment

Figure 1:
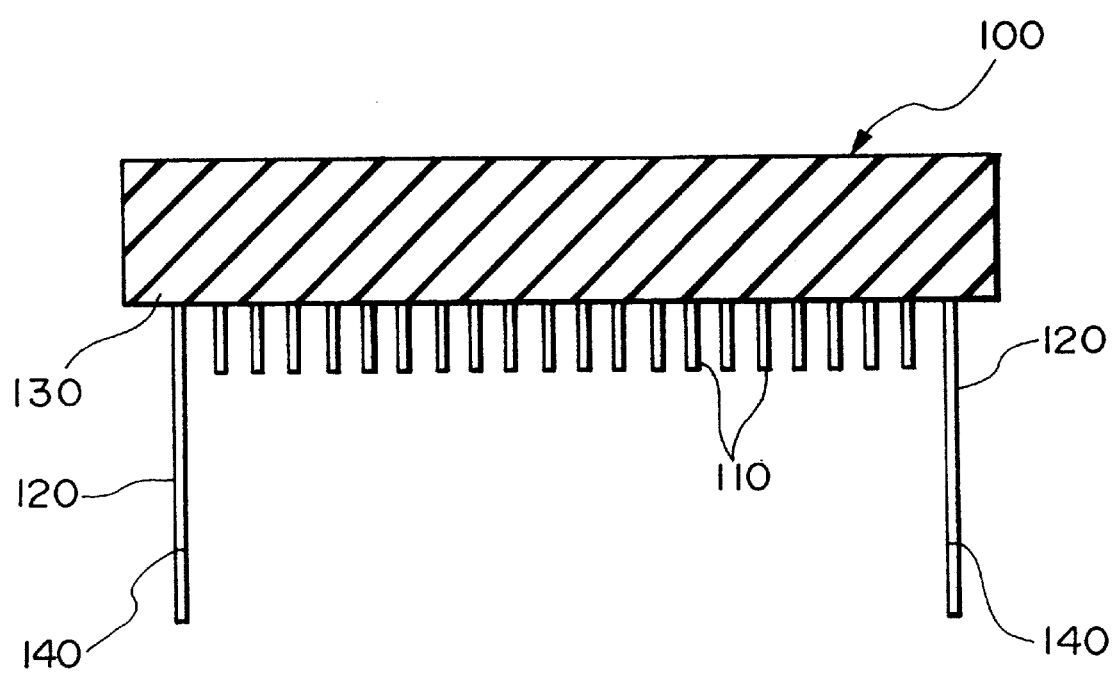
FIG. 1 is a sectional view showing an electronic device of a first embodiment of the present invention.

FIG. 1 shows a first embodiment of the present invention, and an electronic device 100 is a rectangular pin-grid array (PGA) which has lead pins 110, alignment pins 120, and an underside 130.

The lead pins (conducting members) 110 for inputting and outputting electronic signals to and from the electronic device 100, are perpendicularly mounted on the underside 130. The lead pins 110 are aligned with grids, and are made of copper alloy. Four alignment pins 120 are mounted on the underside 130, and are longer than the lead pins 110. Thinner portions 140 having V-shaped sections than the other portion are formed on the alignment pins 120 at a distance of a total length of the lead pins 110 and the thickness of the mounting board from the mounting board. The alignment pins 120 are made of copper alloy.

Figure 2:
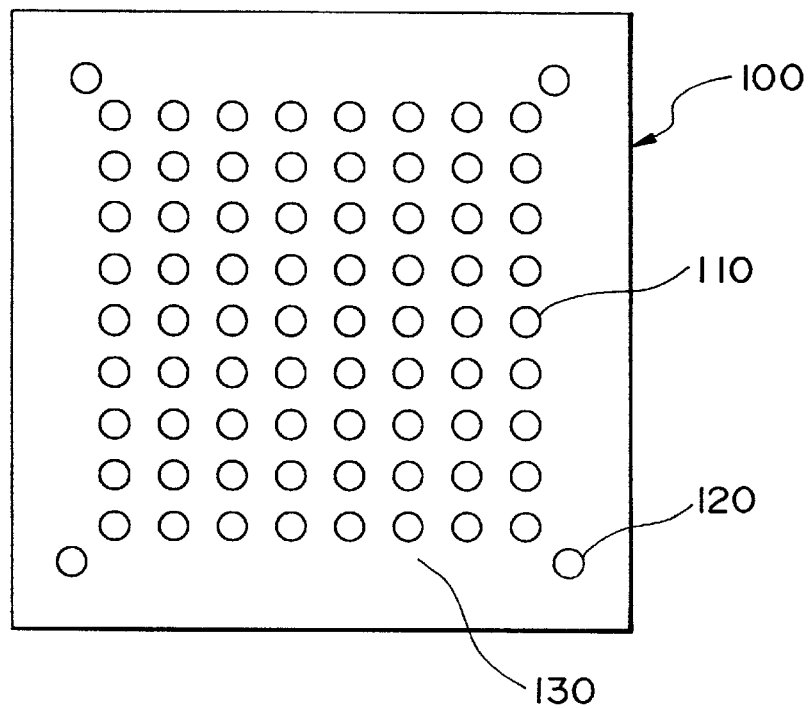
FIG. 2 is a bottom view showing the electronic device of the first embodiment of the present invention.

As shown in FIG. 2, the alignment pins 120 are arranged at four diagonal corners of the electronic device 100 in a periphery area other than the lead pins 110, so that the semiconductor electronic device 100 can be firmly established at a predetermined position on the mounting board by setting as the distance between the alignment pins 120 wider.

Figure 3:
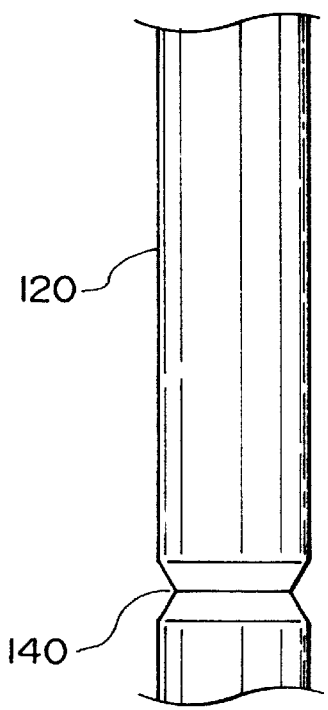
FIG. 3 is an enlarged side view showing a thinner portion of an alignment pin of the electronic device of the present invention.

As shown in FIG. 3, the thinner portion 140 is formed along the circumference of the alignment pin 120 so that the tip of the alignment pin 120 is bendable in any direction. That is, the thinner portion 140 makes it easier to bend the tip of the alignment pin 120. Although four alignment pins are mounted in the embodiment, the number of the alignment pins 120 is not limited to the case, and at least two alignment pins may be mounted.

Second Embodiment

A second embodiment of the present invention will be explained with reference to FIG. 4. This second embodiment is characterized in that only two alignment pins are mounted on the electronic device 100.

Figure 4:
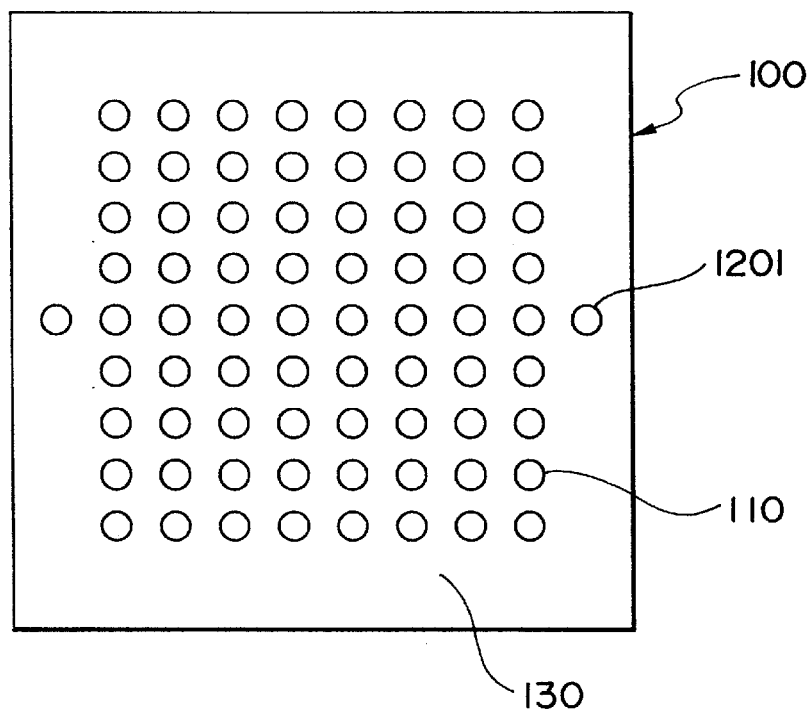
FIG. 4 is a bottom view showing an electronic device of a second embodiment of the present invention.

As shown in FIG. 4, two alignment pins 1201 are mounted on the underside 130 of the electronic device 100, and are arranged on the center line of the electronic device 100 so as to make the distance between the two alignment pins 1201 maximum. That is, the alignment pins 1201 are arranged at midpoints of two opposite sides of the body, so that the semiconductor electronic device 100 can be firmly established at a predetermined position on the mounting board by setting the distance between the alignment pins 1201 wider.

In this embodiment, only two alignment pins 1201 are arranged at the underside of the electronic device, so that the semiconductor electronic device 100 can be firmly set on the mounting board by means of the minimum number of the alignment pins.

Third Embodiment

A third embodiment of the present invention will be explained with reference to FIG. 5. The third embodiment is characterized in that two alignment pins 1202 are arranged at diagonal corners of the electronic device 100 respectively.

Figure 5:
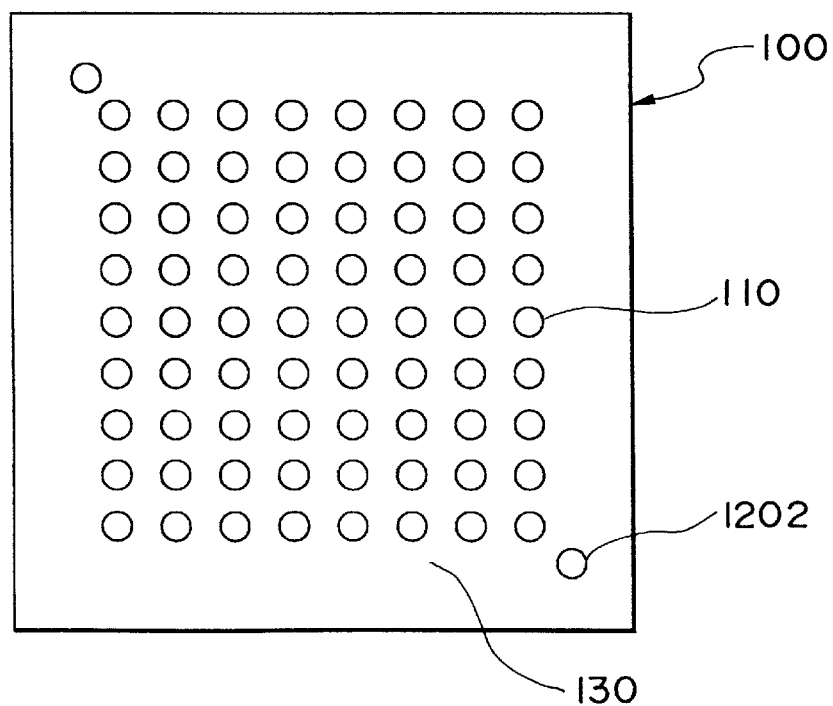
FIG. 5 is a bottom view showing an electronic device of a third embodiment of the present invention.

As shown in FIG. 5, two alignment pins 1202 are mounted on the underside 130 at two diagonal corners of the electronic device 100 so as to maximize the distance between the two alignment pins 1202.

In this embodiment, only two alignment pins 1202 are arranged at two diagonal corners of the electronic device 100, so that the semiconductor electronic device 100 can be firmly set on the mounting board by means of the minimum number of the alignment pins.

Fourth Embodiment

Figure 6:
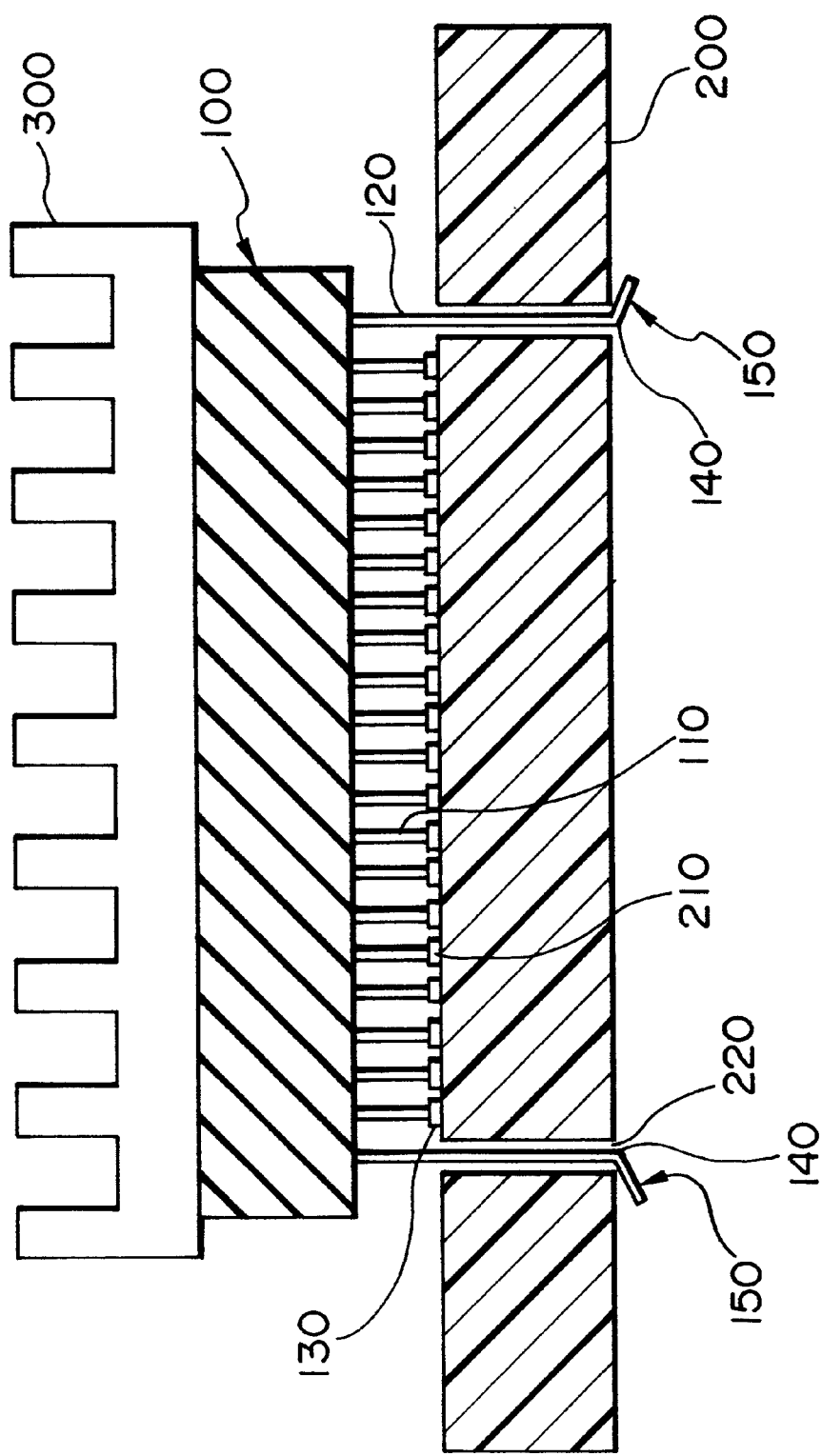
FIG. 6 is a sectional view showing an electronic apparatus of a fourth embodiment of the present invention.

A fourth embodiment according to the present invention will be explained with reference to FIG. 6. As shown in FIG. 6, an electronic apparatus of the fourth embodiment comprises a printed circuit board (mounting board) 200 and an electronic device 100 which is mounted on the upper surface of the printed circuit board 200.

The printed circuit board 200 has a plurality of pads 210 and at least two through holes 220. The pads 210 are arranged on grids on the surface of the printed circuit board 200, and contact lead pins 110 of the electronic device 100 so as to establish electrical connections.

The through holes 220 are arranged to correspond to the respective alignment pins 120 of an electronic device 100. The through holes 220 have inside diameters which are approximately equal to or slightly larger than the outside diameters of the alignment pins 120. By inserting alignment pins 120 into the through holes 220, the lead pins 110 are accurately positioned on the pads 210.

The alignment pins 120 of the electronic device 100 are inserted into the through holes 220 of the printed circuit board 220, and the ends of the alignment pins 120 projecting from the back of the board 200 are bent at thinner portions 140, forming bent portions 150.

The alignment pins 120 inserted into the through holes 220 of the printed circuit board 200 are bonded using a wave-soldering process. That is, solder is provided in advance on the pads 210 of the printed circuit board 200 by printing or other method, and the lead pins 110 are soldered to the pads by heat through the wave-solder process, thereby establishing electrical connections. A heat radiating device 300 is attached to the top of an electronic device 100 by an adhesive.

In the embodiment, it is possible to prevent the electronic device 100 from accidentally falling off from the printed circuit board 200 even when the electronic device 100 positioned on the underside of the printed circuit board 200 is heated, because the alignment pins 120 inserted into through holes 220 is bent to maintain the electronic device 100 at the predetermined position.

Fifth Embodiment

A fifth embodiment of the present invention will be explained with reference to FIG. 7. An electronic apparatus having a mounting structure of the fifth embodiment is characterized in that electronic devices are mounted on both surfaces of a printed circuit board 200.

Figure 7:
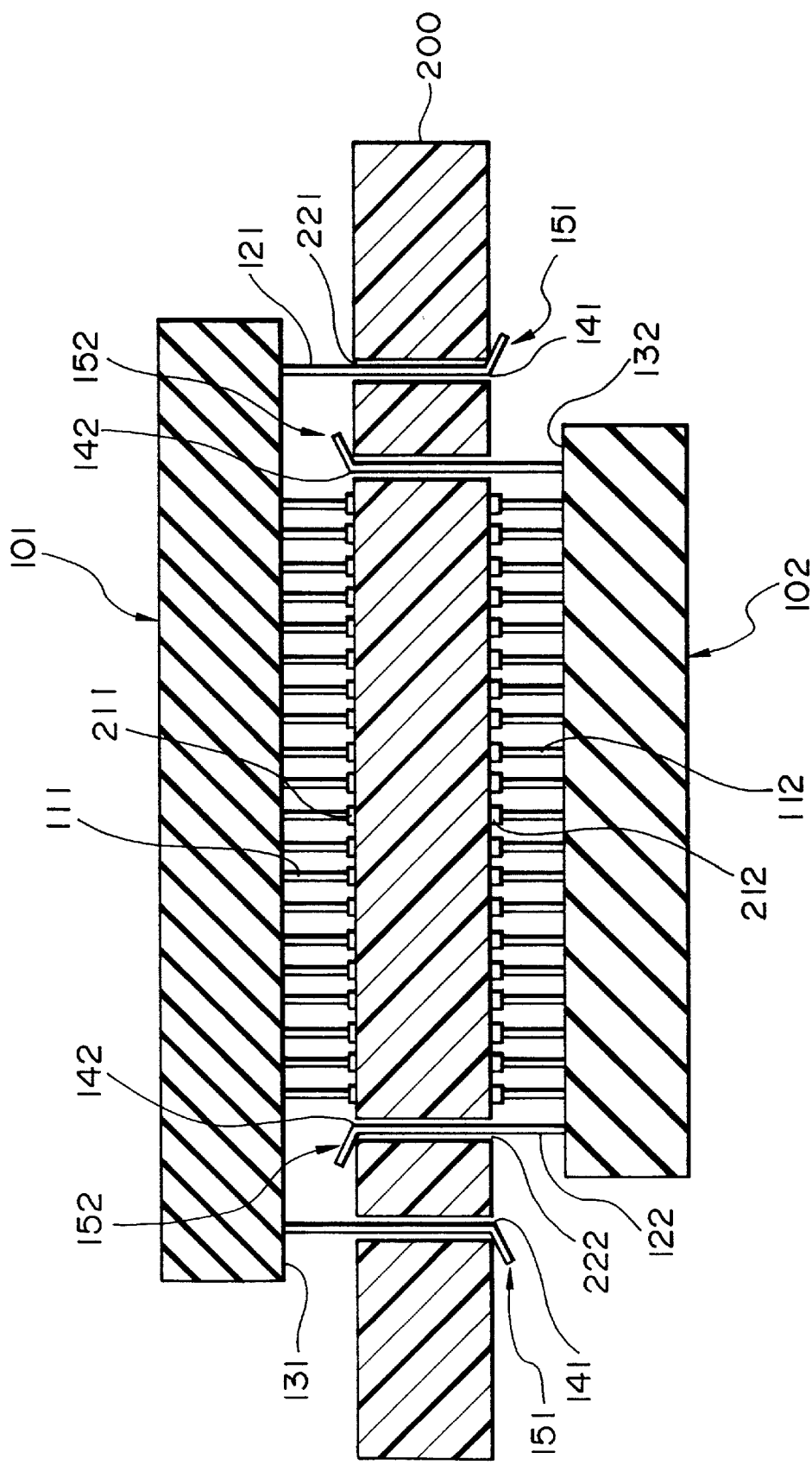
FIG. 7 is a sectional view showing an electronic apparatus of a fifth embodiment of the present invention.

As shown in FIG. 7, the electronic apparatus comprises electronic devices 101 and 102 and a printed circuit board (mounting board) 200. The electronic device 101 and 102 are also pin-grid arrays (PGAs), and the electronic device 101 is mounted on the upper surface of the printed circuit board 200 while the electronic device 102 is mounted on the underside.

The electronic device 101 has a plurality of lead pins 111, alignment pins 121 and an underside 131, and the lead pins 111 and alignment pins 121 are mounted on the underside 131 of the electronic device 101. The electronic device 102, constructed in a similar fashion to the electronic device 101, has a plurality of lead pins 112, alignment pins 122 and an underside 132, and the lead pins 112 and alignment pins 122 are mounted on the underside 132 of the electronic device 102.

A printed circuit board 200 has a plurality of pads 211 and 212 and through holes 221 and 222. The pads 211 are provided on the upper surface of the printed circuit board 200, and are electrically connected to the lead pins 111 of an electronic device 101. The pads 212 are provided on the underside of the printed circuit board 200, and are electrically connected to the lead pins 112 of the electronic device 102.

The alignment pins 121 of the electronic device 101 are inserted into the through holes 221 of the printed circuit board 200, and the ends of the alignment pins 121 projecting from the back of the board 200 are bent. The alignment pins 122 of the electronic device 102 are also inserted into the through holes 222 of the printed circuit board 200, and the ends of the alignment pins 122 projecting from the back of the board 200 are bent.

Next, a method for manufacturing the electronic apparatus of the fifth embodiment will be explained. The manufacturing is accomplished by the steps of mounting the electronic device 102 on one surface of the printed circuit board 200 and mounting the electronic device 101 on the other surface of the printed circuit board 200.

The electronic device 102 is placed on the printed circuit board 200, and the alignment pins 122 are inserted into the through holes 222 of the printed circuit board 200. As the result, the lead pins 112 of the electronic device 102 are accurately positioned on the pads 212 of the printed circuit board 200. The tips of alignment pins 122 are subsequently bent at thinner portions 142, forming bent portions 152, at which point the electronic device 102 is temporarily fixed. Solder is supplied on the pads 212 of the printed circuit board 200 by printing or the other methods, and the lead pins 112 of the electronic device 102 are soldered to the pad 212 by heat, thereby joining the lead pins 112 to the respective pads 212 without misalignment.

The printed circuit board 200 with the electronic device 102 is turned over to mount the electronic device 101. In this situation, the electronic device 102 is placed on the underside of the printed circuit board 200. The alignment pins 121 of the electronic device 101 are inserted into the through holes 221 of the printed circuit board 200. As the result, the lead pins 111 of the electronic device 101 are accurately positioned on the pads 211 of the printed circuit board 200. The tips of alignment pins 121 are subsequently bent at thinner portions 141, forming bent portions 151, at which point the electronic device 102 is temporarily fixed. Solder is supplied to the pads 211 and the through holes 221 and 222 of the printed circuit board 200 by dispensing and the other methods. The lead pins 111 are soldered to the pads 211, the alignment pins 121 are soldered to the through holes 221, and the alignment pins 122 are soldered to the through holes 222 through heating, thereby establishing electrical connections.

In the embodiment, it is possible to prevent the electronic device 101 which was first mounted from falling off from the printed circuit board 200 when the electronic device 102 is subsequently mounted on the printed circuit board 200, because the alignment pins 121 and 122 of the electronic device 101 and 102 inserted into the through holes 220 and the projecting ends are bent.

Although a PGA is employed as the electronic device 100 in this embodiment, it is not limited to this, and the other surface-mounting electronic device, for example, a ball-grid array can be used.

The thinner portion 140 on the alignment pin 120 may be not always necessary. A flexible portion more easily bendable than the other portions, for example, a portion formed of flexible material using a heat treatment or of composite material, may be formed instead. The alignment pin 120 having no thinner portion may be bent.

Although the alignment pins 121 are soldered to the through holes 221 and the alignment pins 122 are soldered to the through holes 222 in the above embodiment, the soldering is not essential, and the mounting may be accomplished only by bending the alignment pins.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. An electronic device comprising:
   a body having an underside;
   a plurality of conducting members for transferring electronic signals; and
   at least two alignment pins mounted perpendicularly on said underside, each of said alignment pins having a flexible portion more easily bendable than other portions thereof, said flexible portion being thinner than said other portions of said alignment pins and being provided around an entire circumference of said each alignment pin such that said alignment pin is bendable in any direction,
   wherein said flexible portion is located at a distance from a surface of said underside of said body of at least a thickness of said body and a length of one of said plurality of conducting members.

2. The electronic device according to claim 1, wherein said body has a rectangular shape, said alignment pins being arranged at diagonal corners of said body respectively.

3. The electronic device according to claim 1, wherein said body has a rectangular shape, said alignment pins being arranged at midpoints of two opposite sides of said body respectively.

4. The electronic device according to claim 1, wherein said body has a rectangular shape, said alignment pins being arranged at four corners of said body respectively.

5. The electronic device according to claim 1, wherein said conducting members are lead pins.

6. The electronic device according to claim 5, wherein said alignment pins being longer than said lead pins.

7. The electronic device according to claim 1, wherein said body is a pin-grid array type.

8. The electronic device according to claim 1, wherein said body is a surface-mounting type.

9. An electronic apparatus comprising:
   a printed circuit board having a plurality of electrically conductive pads and through holes; and
   an electronic device mounted on said board, said electronic device having an alignment pin and a plurality of conducting members for transferring electronic signals, said conducting members being connected to said pads,
   wherein said alignment pins are inserted into said through holes, the projections of said alignment pins from said through holes being bent at a flexible portion in order to establish and to maintain a predetermined position of said electronic device relative to said board, said flexible portion being thinner than other portions of said alignment pins and being provided around an entire circumference of said each alignment pin such that said each alignment pin is bendable in any direction, and
   wherein said flexible portion of said alignment pin is located at a distance from a surface of said electronic device of at least a thickness of said circuit board and a length of one of said plurality of conducting members.

10. The electronic apparatus according to claim 9, wherein said board has at least two through holes, said electronic device having at least two alignment pins.

11. The electronic apparatus according to claim 9, wherein a plurality of said electronic devices are mounted on both surfaces of said board.

* * * * *